(12) United States Patent
Sawa et al.

(10) Patent No.: US 10,283,646 B2
(45) Date of Patent: May 7, 2019

(54) NONVOLATILE SEMICONDUCTOR MEMORY DEVICE AND METHOD FOR MANUFACTURING THE SAME

(71) Applicant: Toshiba Memory Corporation, Tokyo (JP)

(72) Inventors: Keiichi Sawa, Mie (JP); Shinji Mori, Mie (JP); Masayuki Tanaka, Mie (JP); Kenichiro Toratani, Mie (JP); Takashi Furuhashi, Mie (JP)

(73) Assignee: Toshiba Memory Corporation, Tokyo (JP)

(*) Notice: Subject to any disclaimer, the term of this patent is extended or adjusted under 35 U.S.C. 154(b) by 0 days.

(21) Appl. No.: 15/454,618

(22) Filed: Mar. 9, 2017

(65) Prior Publication Data
US 2017/0263780 A1    Sep. 14, 2017

(30) Foreign Application Priority Data
Mar. 11, 2016   (JP) ................................ 2016-048816

(51) Int. Cl.
*H01L 29/788* (2006.01)
*H01L 27/11521* (2017.01)
(Continued)

(52) U.S. Cl.
CPC .... *H01L 29/7883* (2013.01); *H01L 21/28273* (2013.01); *H01L 21/28282* (2013.01);
(Continued)

(58) Field of Classification Search
CPC ............. H01L 29/7883; H01L 29/7926; H01L 29/7889; H01L 21/28282; H01L 21/28273;
(Continued)

(56) References Cited

U.S. PATENT DOCUMENTS

2007/0235793 A1* 10/2007 Yamazaki ........... H01L 29/7881
257/314
2010/0148237 A1   6/2010 Kito et al.
(Continued)

FOREIGN PATENT DOCUMENTS

| JP | 2013-110193 | 6/2013 |
| JP | 2013-534058 A | 8/2013 |
| WO | WO 2012/003301 A2 | 1/2012 |

*Primary Examiner* — Su C Kim
(74) *Attorney, Agent, or Firm* — Finnegan, Henderson, Farabow, Garrett & Dunner, L.L.P.

(57) ABSTRACT

According to one embodiment, a nonvolatile semiconductor memory device includes first and second gate electrode layers, an inter-layer insulating layer, a channel layer, a tunneling insulating layer, first and second charge storage portions, and a blocking insulating layer. The channel layer is separated from the first and second gate electrode layers, and the inter-layer insulating layer. The tunneling insulating layer is provided between the first gate electrode layer and the channel layer. The first charge storage portion is provided between the first gate electrode layer and the tunneling insulating layer. The second charge storage portion is provided the second gate electrode layer and the tunneling insulating layer. The blocking insulating layer is provided between the inter-layer insulating layer and the tunneling insulating layer, between the first gate electrode layer and the first charge storage portion, between the inter-layer insulating layer and the first charge storage portion.

17 Claims, 9 Drawing Sheets

(51) Int. Cl.
  *H01L 27/11556* (2017.01)
  *H01L 29/167* (2006.01)
  *H01L 29/49* (2006.01)
  *H01L 29/66* (2006.01)
  *H01L 21/28* (2006.01)
  *H01L 29/792* (2006.01)

(52) U.S. Cl.
  CPC .. *H01L 27/11521* (2013.01); *H01L 27/11556* (2013.01); *H01L 29/167* (2013.01); *H01L 29/4975* (2013.01); *H01L 29/66825* (2013.01); *H01L 29/7889* (2013.01); *H01L 29/7926* (2013.01)

(58) Field of Classification Search
  CPC ......... H01L 27/11521; H01L 29/66825; H01L 29/4975; H01L 29/167; H01L 27/11556
  See application file for complete search history.

(56) References Cited

U.S. PATENT DOCUMENTS

| | | |
|---|---|---|
| 2012/0132981 A1 | 5/2012 | Imamura et al. |
| 2012/0231593 A1* | 9/2012 | Joo .................. H01L 27/11556 438/264 |
| 2013/0248965 A1 | 9/2013 | Nakai et al. |
| 2013/0264626 A1 | 10/2013 | Sawa |
| 2015/0303215 A1* | 10/2015 | Chang ............... H01L 21/28273 257/314 |
| 2015/0371709 A1* | 12/2015 | Kai .................... G11C 16/0425 365/185.17 |
| 2015/0380422 A1* | 12/2015 | Sharangpani ..... H01L 27/11556 365/185.17 |
| 2017/0084748 A1* | 3/2017 | Yang ................. H01L 29/42324 |

* cited by examiner

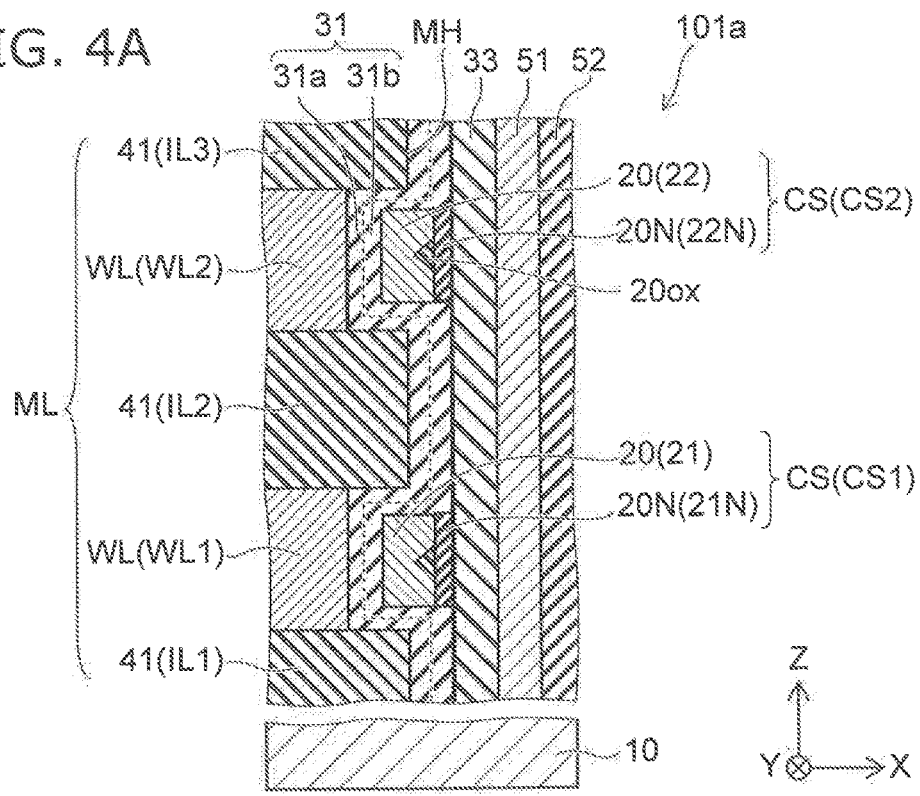
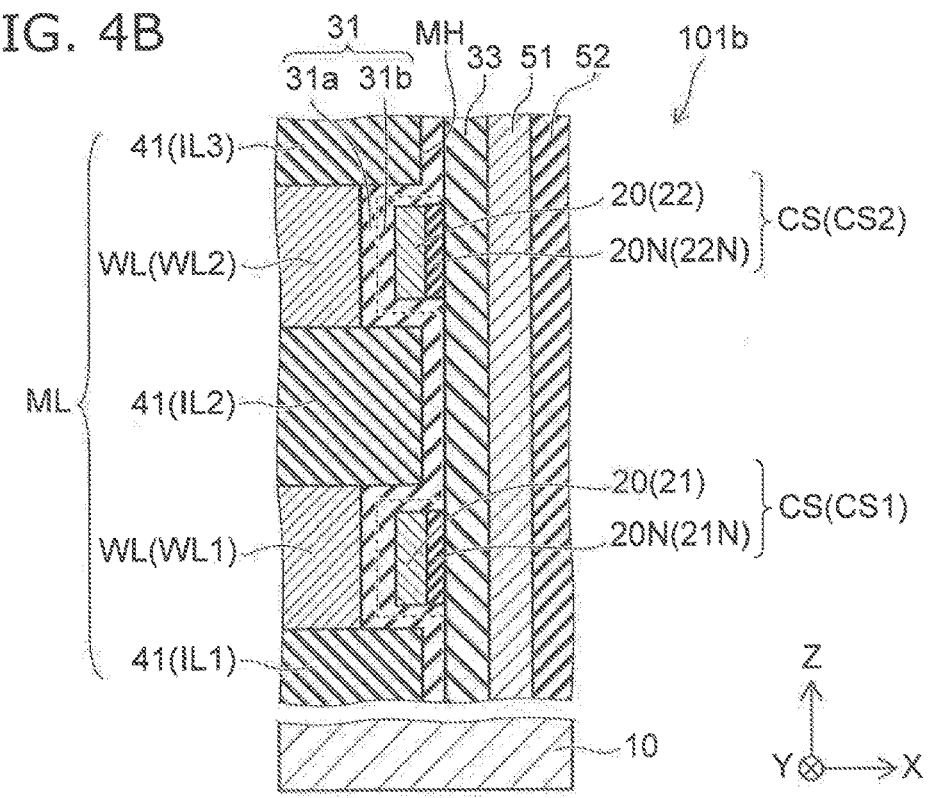

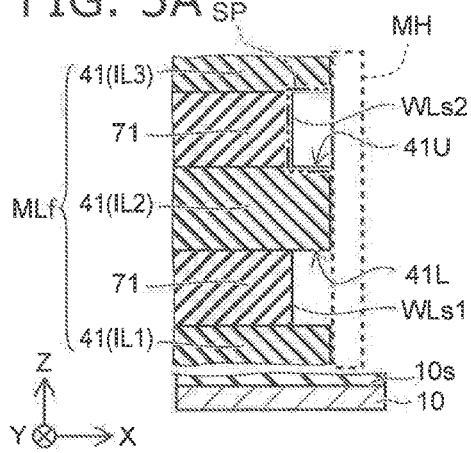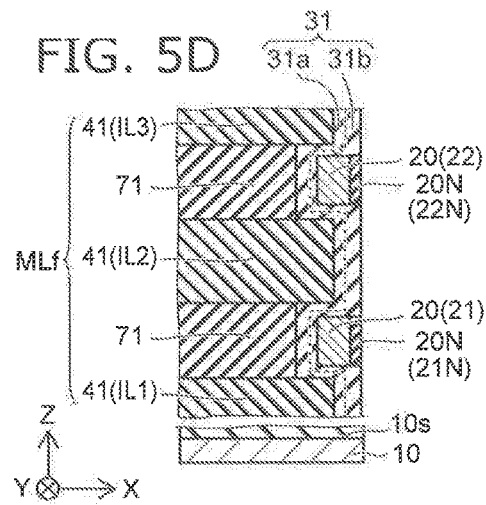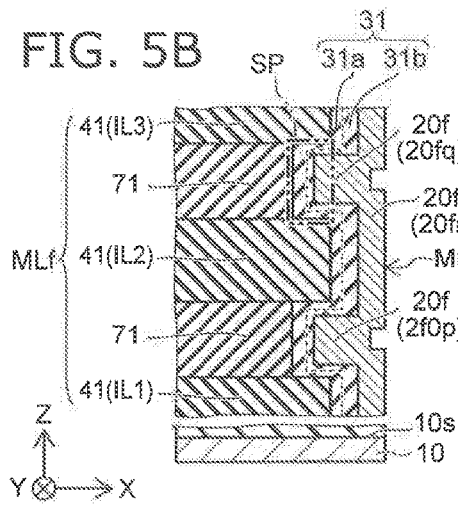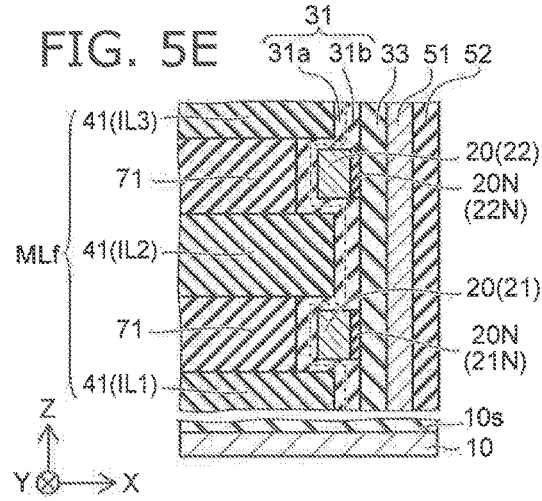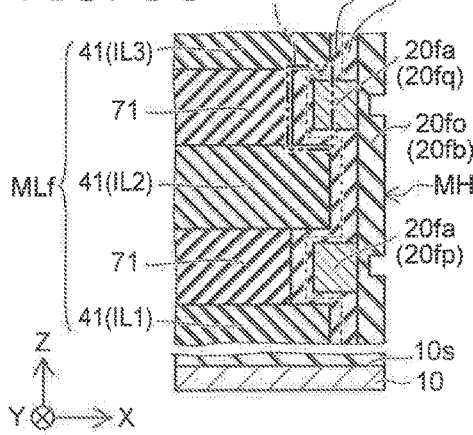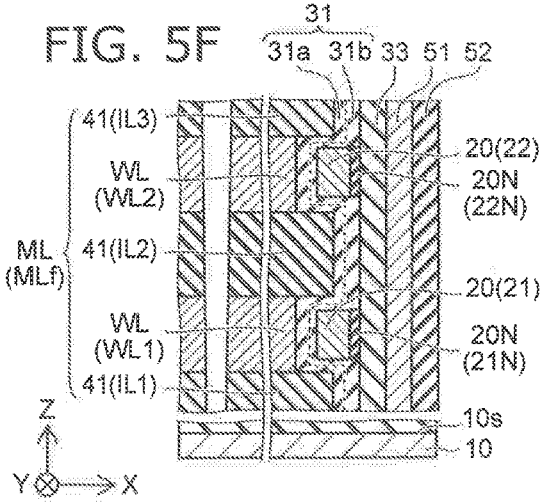

NONVOLATILE SEMICONDUCTOR MEMORY DEVICE AND METHOD FOR MANUFACTURING THE SAME

CROSS-REFERENCE TO RELATED APPLICATIONS

This application is based upon and claims the benefit of priority from Japanese Patent Application No. 2016-048816, filed on Mar. 11, 2016; the entire contents of which are incorporated herein by reference.

FIELD

Embodiments described herein relate generally to a nonvolatile semiconductor memory device and a method for manufacturing the same.

A nonvolatile semiconductor memory device has been proposed in which memory cells are integrated three-dimensionally. It is desirable to increase the reliability of the nonvolatile semiconductor memory device.

BRIEF DESCRIPTION OF THE DRAWINGS

FIG. 4A and FIG. 4B are schematic cross-sectional views illustrating another nonvolatile semiconductor memory device according to the first embodiment;

FIG. 5A to FIG. 5F are schematic cross-sectional views in order of the processes, illustrating the method for manufacturing the nonvolatile semiconductor memory device according to the second embodiment;

DETAILED DESCRIPTION

Figure 1:
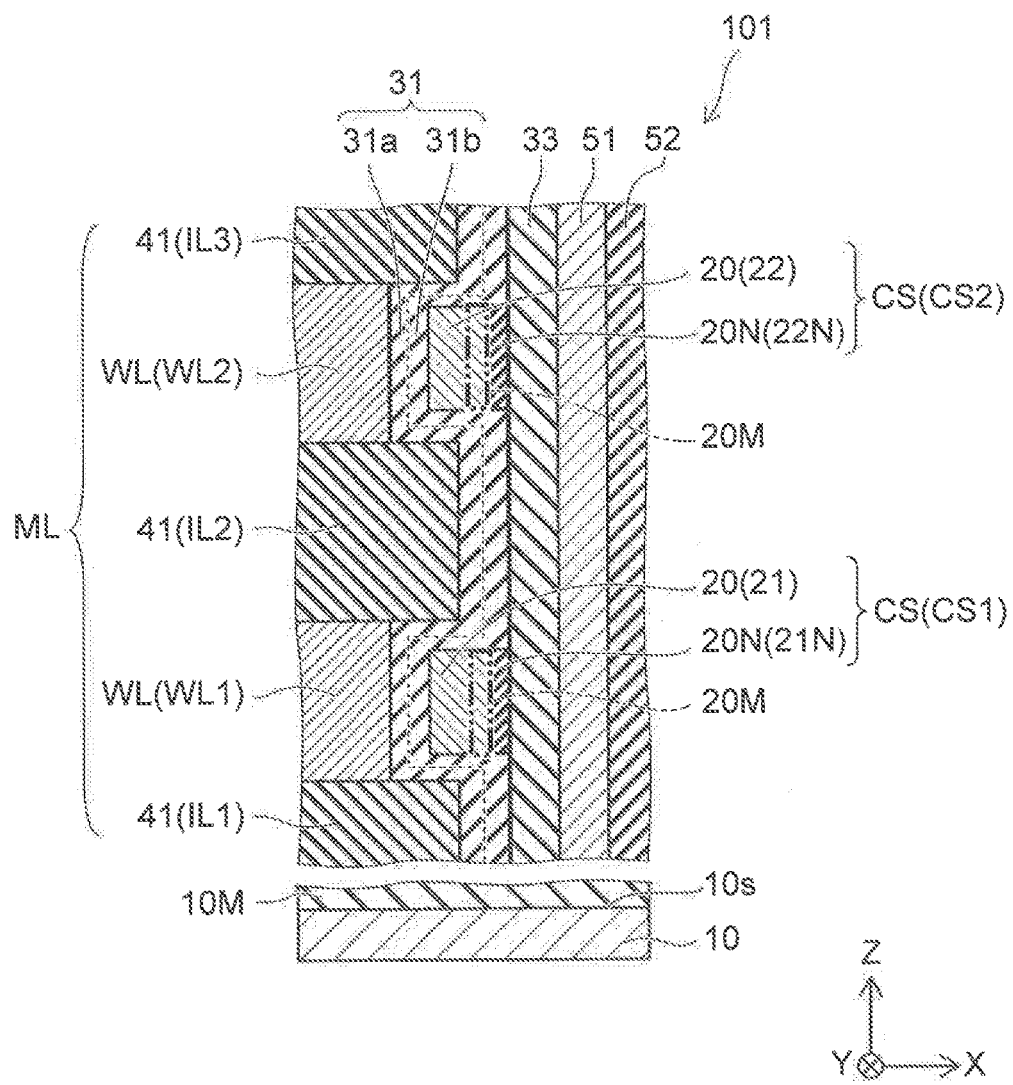
FIG. 1 is a schematic cross-sectional view illustrating a nonvolatile semiconductor memory device according to a first embodiment.

According to one embodiment, a nonvolatile semiconductor memory device includes a first gate electrode layer, a second gate electrode layer, an inter-layer insulating layer, a channel layer, a tunneling insulating layer, a first charge storage portion, a second charge storage portion, and a blocking insulating layer. The second gate electrode layer is separated from the first gate electrode layer in a first direction. The inter-layer insulating layer is provided between the first gate electrode layer and the second gate electrode layer. The channel layer is separated in a second direction crossing the first direction from the first gate electrode layer, the second gate electrode layer, and the inter-layer insulating layer. The tunneling insulating layer is provided between the first gate electrode layer and the channel layer and between the second gate electrode layer and the channel layer. The first charge storage portion includes a first semiconductor layer and is provided between the first gate electrode layer and the tunneling insulating layer. The second charge storage portion includes a second semiconductor layer and is provided between the second gate electrode layer and the tunneling insulating layer. The blocking insulating layer is provided between the inter-layer insulating layer and the tunneling insulating layer, between the first gate electrode layer and the first charge storage portion, between the inter-layer insulating layer and the first charge storage portion, between the inter-layer insulating layer and the second charge storage portion, and between the second gate electrode layer and the second charge storage portion.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic cross-sectional view illustrating a nonvolatile semiconductor memory device according to a first embodiment.

As shown in FIG. 1, the nonvolatile semiconductor memory device 101 according to the embodiment includes a stacked body ML, a channel layer 51, a tunneling insulating layer 33, charge storage portions CS, and a blocking insulating layer 31. In the example, the stacked body ML, the channel layer 51, the tunneling insulating layer 33, the charge storage portions CS, and the blocking insulating layer 31 are provided above a major surface 10s of a substrate 10 (a semiconductor substrate). An intermediate layer 10M may be provided between the major surface 10s and the stacked body ML.

Multiple gate electrode layers WL (conductive layers) and multiple inter-layer insulating layers 41 are stacked alternately in the stacked body ML.

The multiple gate electrode layers WL include, for example, a first gate electrode layer WL1 and a second gate electrode layer WL2. The multiple inter-layer insulating layers 41 include, for example, a first inter-layer insulating layer IL1, a second inter-layer insulating layer IL2, and a third inter-layer insulating layer IL3. The first gate electrode layer WL1 is provided between the first inter-layer insulating layer IL1 and the second inter-layer insulating layer IL2. The second gate electrode layer WL2 is provided between the second inter-layer insulating layer IL2 and the third inter-layer insulating layer IL3.

The second gate electrode layer WL2 is separated from the first gate electrode layer WL1 in a first direction.

A direction (the first direction) from the second gate electrode layer WL2 toward the first gate electrode layer WL1 is taken as a Z-direction. One direction perpendicular to the Z-direction is taken as an X-direction. A direction perpendicular to the Z-direction and the X-direction is taken as a Y-direction. For example, the major surface 10s of the substrate 10 crosses the first direction. In the example, the first direction is perpendicular to the major surface 10s. The X-Y plane is aligned with (e.g., parallel to) the major surface 10s.

The direction in which the multiple gate electrode layers WL and the multiple inter-layer insulating layers 41 are arranged corresponds to the Z-direction (the first direction).

The channel layer 51 is separated in a second direction from the first inter-layer insulating layer IL1, the first gate electrode layer WL1, the second inter-layer insulating layer IL2, the second gate electrode layer WL2, and the third inter-layer insulating layer IL3. The second direction is any direction crossing the Z-direction recited above. In the example, the second direction is the X-direction. In the embodiment, the channel layer 51 and the stacked body ML may overlap in any of multiple directions (the second direction) crossing the Z-direction. For example, the channel layer 51 extends along the Z-direction. The channel layer 51 opposes the side surface of the stacked body ML.

The tunneling insulating layer 33 is provided between the channel layer 51 and each of the multiple gate electrode layers WL. For example, the tunneling insulating layer 33 is provided between the first gate electrode layer WL1 and the channel layer 51 and between the second gate electrode layer WL2 and the channel layer 51. In the example, the tunneling insulating layer 33 extends to be continuous along the Z-direction. In other words, the tunneling insulating layer 33 is provided also between the first inter-layer insulating layer IL1 and the channel layer 51, between the second inter-layer insulating layer IL2 and the channel layer 51, and between the third inter-layer insulating layer IL3 and the channel layer 51.

The charge storage portions CS are provided between the tunneling insulating layer 33 and the multiple gate electrode layers WL. For example, the charge storage portions CS include a first charge storage portion CS1 and a second charge storage portion CS2. The first charge storage portion CS1 is provided between the first gate electrode layer WL1 and the tunneling insulating layer 33. The second charge storage portion CS2 is provided between the second gate electrode layer WL2 and the tunneling insulating layer 33.

In the embodiment, the charge storage portions CS include semiconductor layers 20. The first charge storage portion CS1 includes a first semiconductor layer 21. The second charge storage portion CS2 includes a second semiconductor layer 22. These semiconductor layers 20 are, for example, floating electrodes (floating gates).

In the example, the first charge storage portion CS1 further includes a first charge storage layer 21N in addition to the first semiconductor layer 21. The first charge storage layer 21N is provided between the first semiconductor layer 21 and the tunneling insulating layer 33. Similarly, the second charge storage portion CS2 further includes a second charge storage layer 22N in addition to the second semiconductor layer 22. The second charge storage layer 22N is provided between the second semiconductor layer 22 and the tunneling insulating layer 33. The first charge storage layer 21N and the second charge storage layer 22N include, for example, a nitride (e.g., SiN, etc.).

The blocking insulating layer 31 is provided between the multiple gate electrode layers WL and the multiple charge storage portions CS. For example, the blocking insulating layer 31 is provided between the first gate electrode layer WL1 and the first charge storage portion CS1 (the first semiconductor layer 21) in the second direction (the X-direction). Further, the blocking insulating layer 31 is provided between the second gate electrode layer WL2 and the second charge storage portion CS2 (the second semiconductor layer 22) in the second direction (the X-direction).

In the embodiment, the blocking insulating layer 31 is further provided on the upper surface and the lower surface in FIG. 1 of the charge storage portion CS. In other words, in the first direction (the Z-direction), the blocking insulating layer 31 is provided between the first inter-layer insulating layer IL1 and the first charge storage portion CS1, between the second inter-layer insulating layer IL2 and the first charge storage portion CS1, between the second inter-layer insulating layer IL2 and the second charge storage portion CS2, and between the third inter-layer insulating layer IL3 and the second charge storage portion CS2.

In the example, the blocking insulating layer 31 is continuous between the multiple charge storage portions CS. In other words, the blocking insulating layer 31 is provided also between the second inter-layer insulating layer IL2 and the tunneling insulating layer 33 in the second direction (the X-direction). In the example, in the second direction (the X-direction), the blocking insulating layer 31 is provided also between the first inter-layer insulating layer IL1 and the tunneling insulating layer 33 and between the third inter-layer insulating layer IL3 and the tunneling insulating layer 33.

In the nonvolatile semiconductor memory device 101 according to the embodiment, each portion where the channel layer 51 and the multiple gate electrode layers WL cross is used as one memory cell. In the embodiment, the charge storage portions CS are independent between the multiple memory cells.

In the nonvolatile semiconductor memory device 101 according to the embodiment, a portion of the blocking insulating layer 31 is provided between the gate electrode layer WL and the charge storage portion CS. Thereby, the movement of charge between the gate electrode layer WL and the charge storage portion CS is suppressed. Good retention characteristics are obtained in the direction (e.g., the X-direction) connecting the gate electrode layer WL and the charge storage portion CS.

In the embodiment, a portion of the blocking insulating layer 31 is provided also on the upper surface and the lower surface in FIG. 1 of the charge storage portion CS. Thereby, the movement of the charge between two charge storage portions CS (the movement in the Z-direction) is suppressed. Good retention characteristics are obtained in the direction (the Z-direction) connecting the two charge storage portions CS.

The blocking insulating layer 31 is continuous between the multiple charge storage portions CS. By the blocking insulating layer 31 being continuous, high insulative properties of the blocking insulating layer 31 are obtained. The blocking property of the blocking insulating layer 31 is higher.

There is a first reference example in which the charge storage portion is continuous between the multiple memory cells. For example, a charge storage layer such as a silicon nitride layer or the like is provided to be continuous in the Z-direction. In such a case, the charge that is retained in one memory cell (a portion of the charge storage layer) moves easily to other memory cells (other portions of the charge storage layer).

On the other hand, there is a second reference example in which the charge storage portions CS are independent between the multiple memory cells; and the blocking insulating layers 31 are provided only between the gate electrode layers WL and the charge storage portions CS. In such a case, the blocking insulating layers 31 are not provided on the upper surface and lower surface of the charge storage portion CS. In the second reference example, the charge moves easily between two charge storage portions CS. For example, "lateral charge de-trapping" occurs easily.

Conversely, in the embodiment, the first charge storage portion CS1 and the second charge storage portion CS2 are separated in the Z-direction; and the charge storage portions CS are independent between the memory cells. Thereby, the movement of the charge between the memory cells is suppressed. The blocking insulating layer 31 is provided also on the upper surface and the lower surface in FIG. 1 of the charge storage portion CS. Thereby, the movement of the charge between the memory cells is further suppressed; and the charge retention characteristics improve. The data that is stored can be maintained appropriately for a long period of time; and the reliability of the nonvolatile semiconductor memory device increases. In the embodiment, the blocking insulating layer 31 is continuous between two charge storage portions CS. Thereby, the insulative properties of the blocking insulating layer 31 are high; and the suppression effect of the movement of the charge is even higher.

In the embodiment, because the movement of the charge to other memory cells is suppressed, for example, the distance between two gate electrode layers WL can be set to be short. Thereby, the memory cells can have higher integration. The bit density can be increased.

In the example of FIG. 1, the semiconductor layer 20 (e.g., the floating electrode) and a charge storage layer 20N are provided in the charge storage portion CS. The difference between the threshold voltage in the program state and the threshold voltage in the erase state can be larger in the case where the semiconductor layer 20 and the charge storage layer 20N are provided than in the case where only the charge storage layer 20N is provided. For example, the programming efficiency and the erasing efficiency increase. The programming/erasing operations can be performed at low voltages. Low-power operations are possible.

In the nonvolatile semiconductor memory device 101 illustrated in FIG. 1, the blocking insulating layer 31 is provided between the semiconductor layer 20 (e.g., the floating electrode) and the inter-layer insulating layer 41 in the Z-direction. Thereby, the spreading of the fringe electric field generated by the semiconductor layer 20 in the Z-direction is suppressed. For example, the control efficiency of the channel increases.

As described below, the channel layer 51 may extend in the first direction (the Z-direction) through the stacked body ML. For example, the channel layer 51 may pierce the stacked body ML. In such a case, a core insulating film 52 may be provided as illustrated in FIG. 1. The channel layer 51, the tunneling insulating layer 33, and the charge storage portions CS are provided between the core insulating film 52 and the stacked body ML.

As shown in FIG. 1, the blocking insulating layer 31 may include a multilayer film. The blocking insulating layer 31 includes, for example, a first blocking film 31a and a second blocking film 31b. The first blocking film 31a is disposed between the second blocking film 31b and each of the first inter-layer insulating layer IL1, the first gate electrode layer WL1, the second inter-layer insulating layer IL2, the second gate electrode layer WL2, and the third inter-layer insulating layer IL3. The first blocking film 31a and the second blocking film 31b each are continuous.

In other words, for example, the first blocking film 31a is provided between the first inter-layer insulating layer IL1 and the tunneling insulating layer 33 in the X-direction, between the first inter-layer insulating layer IL1 and the first semiconductor layer 21 in the Z-direction, between the first gate electrode layer WL1 and the first semiconductor layer 21 in the X-direction, between the second inter-layer insulating layer IL2 and the first semiconductor layer 21 in the Z-direction, between the second inter-layer insulating layer IL2 and the tunneling insulating layer 33 in the X-direction, between the second inter-layer insulating layer IL2 and the second semiconductor layer 22 in the Z-direction, between the second gate electrode layer WL2 and the second semiconductor layer 22 in the X-direction, between the third inter-layer insulating layer IL3 and the second semiconductor layer 22 in the Z-direction, and between the third inter-layer insulating layer IL3 and the tunneling insulating layer 33 in the X-direction.

In the example, in the X-direction, the second blocking film 31b is provided between the tunneling insulating layer 33 and each layer of the first inter-layer insulating layer IL1, the first gate electrode layer WL1, the second inter-layer insulating layer IL2, the second gate electrode layer WL2, and the third inter-layer insulating layer IL3. Further, in the Z-direction, the second blocking film 31b is provided between the first blocking film 31a and the tunneling insulating layer 33 in regions between the first inter-layer insulating layer IL1 and the first semiconductor layer 21, between the second inter-layer insulating layer IL2 and the first semiconductor layer 21, between the second inter-layer insulating layer IL2 and the second semiconductor layer 22, between the third inter-layer insulating layer IL3 and the second semiconductor layer 22. As described below, the second blocking film 31b may not be provided in at least a portion of the regions between the tunneling insulating layer 33 and each of the first inter-layer insulating layer IL1, the second inter-layer insulating layer IL2, and the third inter-layer insulating layer IL3.

The first blocking film 31a includes, for example, at least one of aluminum oxide, hafnium oxide, lanthanum oxide, zirconia oxide, or silicon nitride. The second blocking film 31b includes, for example, silicon oxide.

The charge storage layer 20N includes, for example, silicon nitride.

The semiconductor layer 20 includes, for example, silicon. For example, the semiconductor layer 20 (e.g., the floating electrode) may include an impurity. The impurity is, for example, boron, etc. For example, the work function of the semiconductor layer 20 functioning as the floating electrode can be controlled by the impurity. For example, a concentration distribution of the impurity suited to multi-bit memory cells is formed. Further, the depletion layer of the semiconductor layer (the floating electrode) can be controlled by adding the impurity to the semiconductor layer 20 (the floating electrode). Thereby, the equivalent oxide thickness (EOT) of the memory cell can be reduced. Thereby, for example, the operating voltage of the device can be reduced. For example, in the case where boron is used as the impurity, the work function of the semiconductor layer 20 can be set to be deep. Thereby, the charge retention improves.

For example, the semiconductor layer 20 may include a silicide (a metal silicide). The semiconductor layer 20 may include at least one of nickel, cobalt, ruthenium, or titanium.

In the embodiment, for example, an intermediate region 20M may be provided between the semiconductor layer 20 and the charge storage layer 20N. The concentration of nitrogen changes in a direction (in the example, the X-direction) from the semiconductor layer 20 toward the charge storage layer 20N in the intermediate region 20M. For example, the profile of the concentration of nitrogen in the intermediate region 20M is controlled. For example, the charge retention characteristics and erasing characteristics of the memory cell can be corrected. In the case where the semiconductor layer 20 includes the silicide (the metal silicide), the intermediate region 20M suppresses the diffusion of the silicide (the metal silicide) from the semiconductor layer 20 toward the charge storage layer 20N. For example, the intermediate region 20M may include oxygen and carbon. In the case where the intermediate region 20M includes silicon nitride, for example, the diffusion of the silicide is suppressed easily because a trap level due to the silicon nitride is formed.

In the embodiment, the gate electrode layer WL includes, for example, at least one of tungsten, nickel, or copper.

An example of a method for manufacturing the nonvolatile semiconductor memory device according to the embodiment will now be described.

FIG. 2A to FIG. 2F are schematic cross-sectional views in order of the processes, illustrating the method for manufacturing the nonvolatile semiconductor memory device according to the first embodiment.

Figure 2A:
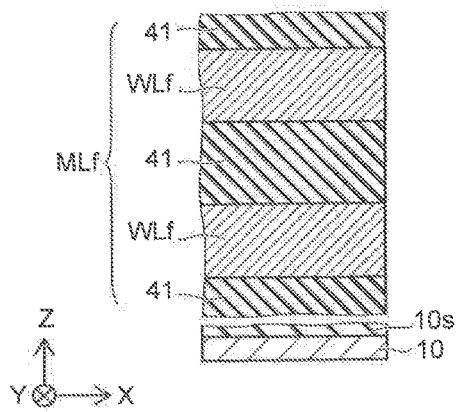
FIG. 2A to FIG. 2F are schematic cross-sectional views in order of the processes, illustrating the method for manufacturing the nonvolatile semiconductor memory device according to the first embodiment.

As shown in FIG. 2A, films WLf that are used to form the gate electrode layers WL are stacked alternately with the inter-layer insulating layers 41 on the major surface 10s of the substrate 10. Thereby, a stacked main body MLf is formed. For example, the uppermost layer of the stacked main body MLf may be the film WLf.

For example, the film WLf that is used to form the gate electrode layer WL is formed by CVD (Chemical Vapor Deposition) using tungsten hexafluoride at about 2000 Pa or less. The pressure is, for example, about 2000 Pa or less. For example, the inter-layer insulating layer 41 is formed by CVD using tetraethyl orthosilicate. The temperature is, for example, not less than 300° C. and not more than 700° C.; and the pressure is, for example, about 2000 Pa or less.

Figure 2D:
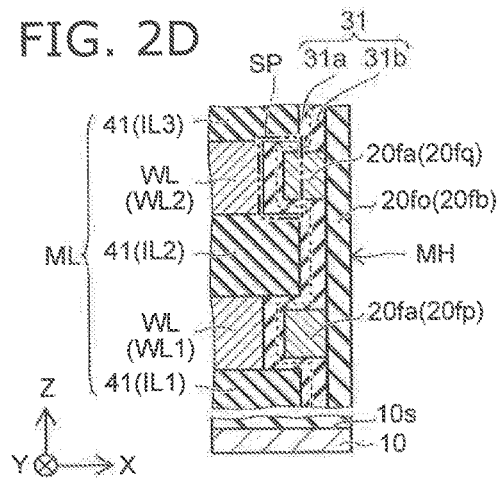
Figure 2B:
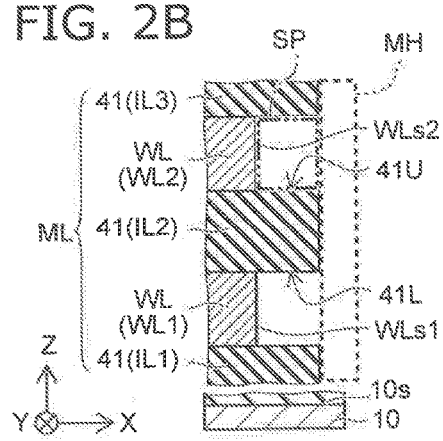

As shown in FIG. 2B, a hole MH (e.g., a memory hole) is formed in the stacked main body MLf; and portions of the films WLf are removed via the hole MH. For example, the hole MH is formed by performing anisotropic etching such as RIE (Reactive Ion Etching), etc., using a mask (not illustrated). For example, a polysilicon layer is used as the mask.

When removing (etching) the portions of the films WLf via the hole MH, for example, an alkali etchant such as ammonia or the like is used as the etchant. Thereby, the films WLf can be etched selectively. The side surfaces of the films WLf inside the hole MH recede. Thereby, the gate electrode layers WL and the inter-layer insulating layers 41 are formed; and the stacked body ML is formed. For example, a first side surface WLs1 of the first gate electrode layer WL1 and a second side surface WLs2 of the second gate electrode layer WL2 recede. Spaces SP are formed in the locations inside the hole MH where the films WLf are removed. In the case where the film WLf is formed at the uppermost layer of the stacked main body MLf, the film WLf of the uppermost layer is removed by this etching.

Figure 2E:
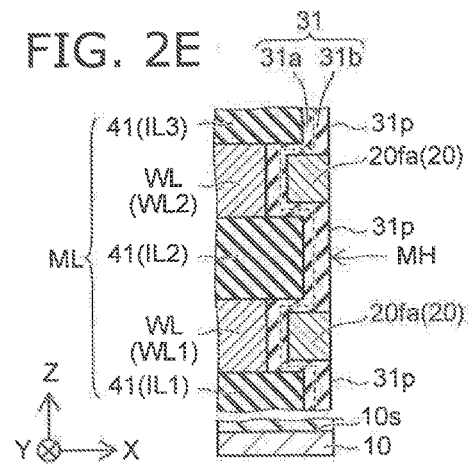
Figure 2C:
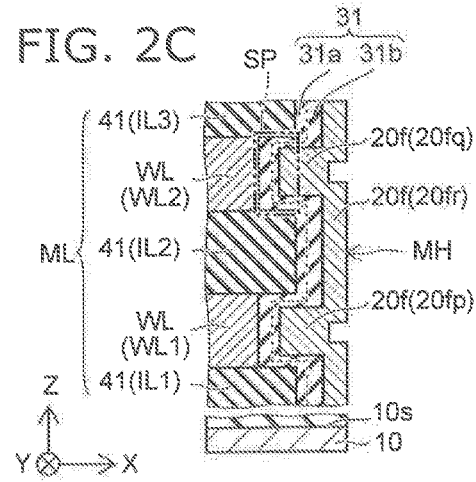

As shown in FIG. 2C, the blocking insulating layer 31 is formed on the side wall of the hole MH; and a semiconductor film 20f is formed. To form the blocking insulating layer 31, for example, the first blocking film 31a (e.g., the silicon nitride film) is formed on the side wall of the hole MH; and subsequently, the second blocking film 31b (e.g., the silicon oxide film, etc.) is further formed. Thereby, the blocking insulating layer 31 is formed on the side wall of the hole MH. A portion of the blocking insulating layer 31 may be formed also at the uppermost layer of the stacked body ML.

To form the first blocking film 31a, for example, a film that includes silicon nitride is deposited by ALD (Atomic Layer Deposition) using dichlorosilane and ammonia. The temperature is, for example, not less than 300° C. and not more than 800° C.; and the pressure is, for example, about 2000 Pa or less.

To form the second blocking film 31b, for example, a film that includes silicon oxide is deposited by ALD using tris(dimethylamino)silane and ozone. The temperature is, for example, not less than 400° C. and not more than 800° C.; and the pressure is, for example, about 2000 Pa or less.

To form the semiconductor film 20f, for example, a film that includes silicon is deposited by CVD using silane. The temperature is, for example, not less than 400° C. and not more than 800° C.; and the pressure is, for example, 2000 Pa or less. The spaces SP are filled with a portion of the semiconductor film 20f. Thereby, the semiconductor film 20f is formed.

As shown in FIG. 2D, an oxide film 20fo is formed by oxidizing a portion of the semiconductor film 20f via the remaining space of the hole MH. In the oxidization, for example, the portion (a portion 20fb) of the semiconductor film 20f is oxidized in an oxygen atmosphere at a temperature of not less than 500° C. and not more than 1000° C. At this time, a portion 20fa of the semiconductor film 20f that is provided inside the spaces SP is not oxidized. The oxidized portion 20fb of the semiconductor film 20f becomes the oxide film 20fo.

As shown in FIG. 2E, the oxide film 20fo is removed by etching via the remaining space of the hole MH. For example, hydrofluoric acid or the like is used as the etchant. The semiconductor layer 20 is exposed inside the hole MH by the removal of the oxide film 20fo. A portion 31p of the blocking insulating layer 31 formed on the side wall of the inter-layer insulating layer 41 is exposed inside the hole MH.

Figure 2F:
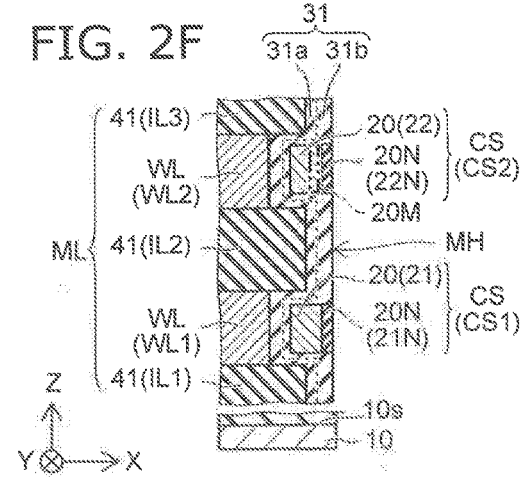

As shown in FIG. 2F, the charge storage layer 20N is formed by nitriding a portion of the semiconductor film 20f (a portion of the portion 20fa) via the hole MH. For example, ammonia gas is introduced to the hole MH. Thereby, a portion of the semiconductor film 20f is nitrided; and the nitrided portion becomes the charge storage layer 20N. The remaining portion of the semiconductor film 20f (the portion 20fa) becomes the semiconductor layer 20 (e.g., the first semiconductor layer 21 and the second semiconductor layer 22). At this time, the intermediate region 20M may be formed between the semiconductor layer 20 and the charge storage layer 20N.

Subsequently, the tunneling insulating layer 33 is formed in the remaining space of the hole MH (referring to FIG. 1). To form the tunneling insulating layer 33, for example, a layer that includes silicon oxide is deposited by ALD using tris(dimethylamino)silane and ozone. The temperature is, for example, not less than 400° C. and not more than 800° C.; and the pressure is, for example, about 2000 Pa or less. Thereby, the tunneling insulating layer 33 is formed.

The channel layer 51 is formed on the side wall of the tunneling insulating layer 33 (referring to FIG. 1). To form the channel layer 51, for example, a layer that includes silicon is deposited by CVD using silane. The temperature is, for example, not less than 400° C. and not more than 800° C.; and the pressure is about 2000 Pa or less. Further, the core insulating film 52 is formed. Thereby, the channel layer 51 is formed inside the hole MH. The core insulating film 52 is formed as necessary.

By the processes recited above, the nonvolatile semiconductor memory device 101 is manufactured.

Thus, in the manufacturing method, the inter-layer insulating layer 41 is formed on the first film (the film WLf used to form the first gate electrode layer WL1); and the second film (the film WLf used to form the second gate electrode layer WL2) is formed on the inter-layer insulating layer 41 (referring to FIG. 2A). Thereby, the stacked main body MLf that includes the first film (the film WLf used to form the first gate electrode layer WL1), the inter-layer insulating layer 41, and the second film (the film WLf used to form the second gate electrode layer WL2) is formed.

Then, a portion of an upper surface 41U of the inter-layer insulating layer 41 and a portion of a lower surface 41L of the inter-layer insulating layer 41 are exposed by causing the side surface of the first film and the side surface of the second film recited above to recede (referring to FIG. 2B). The side surface of the first film caused to recede becomes the first side surface WLs1 of the first gate electrode layer WL1; and the side surface of the second film caused to recede becomes the second side surface WLs2 of the second gate electrode layer WL2.

The blocking insulating layer is formed on the first side surface WLs1 caused to recede, the second side surface WLs2 caused to recede, the portion of the upper surface 41U of the inter-layer insulating layer 41 recited above, the portion of the lower surface 41L of the inter-layer insulating layer 41 recited above, and the side surface of the inter-layer insulating layer 41 (referring to FIG. 2C).

Further, the semiconductor film 20f that covers the blocking insulating layer 31 is formed (referring to FIG. 2C). The semiconductor film 20f includes a first portion 20fp, a second portion 20fq, and a third portion 20fr (referring to FIG. 2C). The first portion 20fp overlaps the first gate electrode layer WL1 in the second direction (e.g., the X-direction, etc.) crossing a direction (the Z-direction) from the first gate electrode layer WL1 toward the second gate electrode layer WL2 (referring to FIG. 2C). The second portion 20fq overlaps the second gate electrode layer WL2 in the second direction (referring to FIG. 2C). The third portion 20fr overlaps the inter-layer insulating layer 41 in the second direction (referring to FIG. 2C).

Subsequently, as described above, a portion of the semiconductor film 20f is oxidized; and the portion (the third portion 20fr) is removed (referring to FIG. 2D). In other words, a portion of the blocking insulating layer 31 is exposed by removing the third portion 20fr (referring to FIG. 2E).

Then, the first charge storage layer 21N is formed from a portion of the first portion 20fp and the second charge storage layer 22N is formed from a portion of the second portion 20fq by nitriding the portion of the first portion 20fp (the first semiconductor layer 21) and the portion of the second portion 20fq (the second semiconductor layer 22) (referring to FIG. 2F).

Then, the tunneling insulating layer 33 is formed on the first charge storage layer 21N, the second charge storage layer 22N, and the exposed portion of the blocking insulating layer 31 (referring to FIG. 1). The channel layer 51 is formed on a portion of the tunneling insulating layer 33 (referring to FIG. 1). Thereby, the nonvolatile semiconductor memory device according to the embodiment is manufactured.

In the embodiment, the charge storage layer 20N is formed by nitriding a portion of the semiconductor film 20f. The remaining portion of the semiconductor film 20f becomes the semiconductor layer 20. For example, the intermediate region 20M may be formed between the semiconductor film 20f and the charge storage layer 20N.

In the manufacturing method recited above, the multiple spaces SP are formed by causing the films WLf used to form the gate electrode layers WL to recede by etching (referring to FIG. 2B). After forming the blocking insulating layer 31 on the inner walls of the spaces SP, the charge storage portions CS are formed in the spaces SP. Thereby, for example, the first charge storage portion CS1 and the second charge storage portion CS2 are formed to be separated in the Z-direction. The blocking insulating layer 31 may be formed also between the first charge storage portion CS1 and the second charge storage portion CS2.

In the manufacturing method recited above, a method for manufacturing a nonvolatile semiconductor memory device can be provided in which the reliability can be increased.

An example of another method for manufacturing the nonvolatile semiconductor memory device 101 according to the embodiment will now be described. In this method, a metal layer is formed on a portion of the semiconductor layer 20; and the portion of the semiconductor layer 20 is silicided.

Figure 3A:
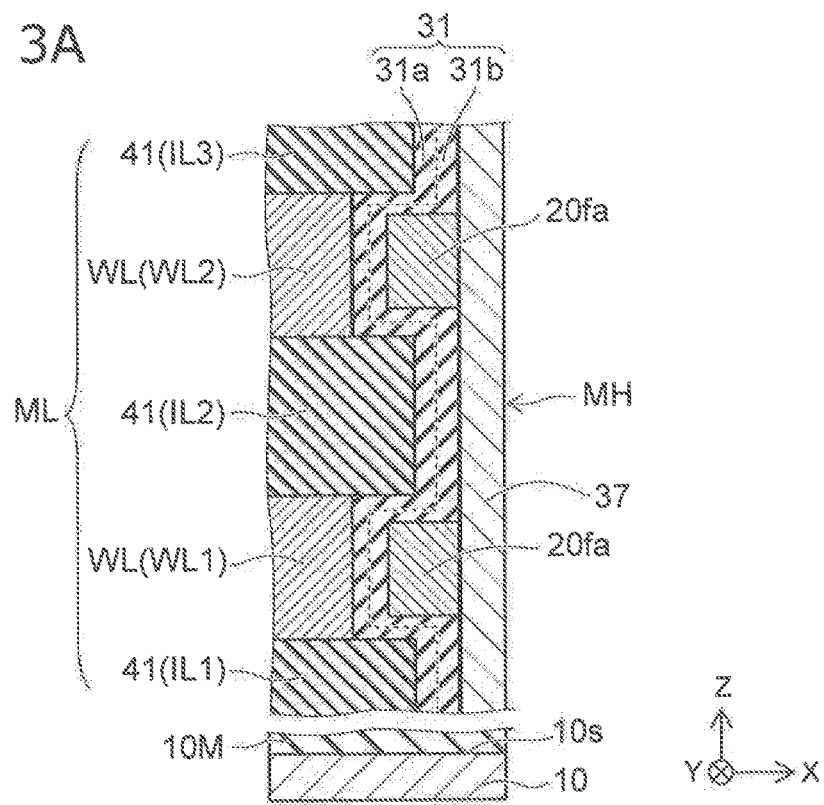
FIG. 3A and FIG. 3B are schematic cross-sectional views in order of the processes, illustrating the other method for manufacturing the nonvolatile semiconductor memory device according to the first embodiment.
Figure 3B:
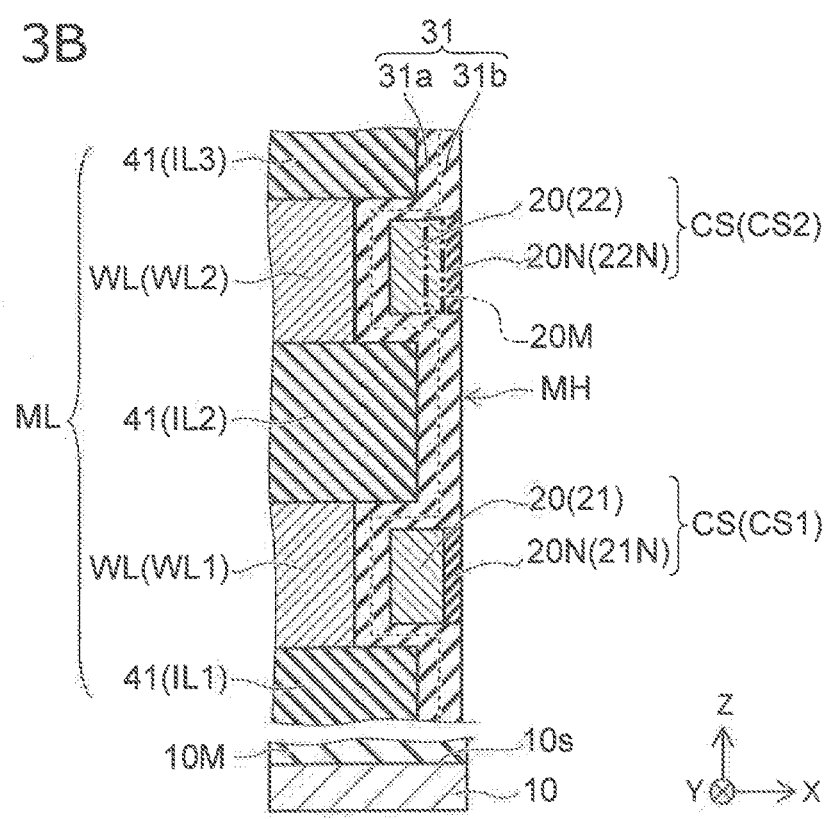

FIG. 3A and FIG. 3B are schematic cross-sectional views in order of the processes, illustrating the other method for manufacturing the nonvolatile semiconductor memory device according to the first embodiment.

In the example, similarly to the manufacturing method described above, the processes shown in FIGS. 2A to 2E are implemented. In other words, the oxide film 20fo illustrated in FIG. 2D is removed by etching; and a portion of the semiconductor layer 20 and a portion of the blocking insulating layer 31 are exposed inside the hole MH.

Subsequently, as shown in FIG. 3A, a metal layer 37 is formed inside the hole MH. A portion of the metal layer 37 contacts the portion 20fa of the semiconductor film 20f. For example, to form the metal layer 37, a material that includes at least one of nickel, cobalt, ruthenium, or titanium is deposited using CVD. For example, annealing is performed in a nitrogen atmosphere. Thereby, the semiconductor layer 20 is silicided.

As shown in FIG. 3B, the metal layer 37 is removed by etching. Thereby, the portion 20fa of the semiconductor film 20f is exposed inside the hole MH. Further, a portion of the portion 20fa of the semiconductor film 20f is nitrided via the hole MH. The nitrided portion of the semiconductor film 20f becomes the charge storage layer 20N. The remaining portion of the portion 20fa of the semiconductor film 20f becomes the semiconductor layer 20. Thus, the semiconductor layer 20 that includes the silicided portion is formed.

Subsequently, similarly to those described above, the tunneling insulating layer 33 is formed inside the hole MH; and the channel layer 51 is formed on the side wall of the tunneling insulating layer 33. The core insulating film 52 is formed inside the hole MH as necessary (referring to FIG. 1).

By the processes recited above, the nonvolatile semiconductor memory device 101 according to the embodiment is manufactured.

In the example, at least a portion of the semiconductor layer 20 is silicided. Thereby, for example, the difference between the work functions of the semiconductor layer 20 and the tunneling insulating layer 33 is large. Thereby, the barrier height between the tunneling insulating layer 33 and the charge storage portion CS (the semiconductor layer 20 and the charge storage layer 20N) increases. Thereby, the charge retention characteristics improve. The reliability of the nonvolatile semiconductor memory device increases.

FIG. 4A and FIG. 4B are schematic cross-sectional views illustrating another nonvolatile semiconductor memory device according to the first embodiment.

As in the nonvolatile semiconductor memory device 101a shown in FIG. 4A, an oxide region 20ox may be provided in the charge storage portion CS. The oxide region 20ox is provided between a portion of the semiconductor layer 20 and a portion of the charge storage layer 20N. For example, the oxide region 20ox is formed by oxidizing a portion of the portion used to form the semiconductor layer 20 in the process shown in FIG. 2D.

As in the nonvolatile semiconductor memory device 101b shown in FIG. 4B, the second blocking film 31b may not be provided in the region of at least a portion of the region between the first blocking film 31a and the tunneling insulating layer 33. In the example as well, the second blocking film 31b is provided between the first blocking film 31a and the charge storage portion CS. For example, such a configuration is formed by removing a portion of the second blocking film 31b and the oxide film 20fo by etching in the process shown in FIG. 2E.

In the nonvolatile semiconductor memory devices 101a and 101b as well, good retention characteristics are obtained; and high reliability is obtained.

Second Embodiment

In a second embodiment, the method for manufacturing the nonvolatile semiconductor memory device is different from that of the first embodiment. In the second embodiment, for example, sacrificial layers and insulating layers are stacked alternately; subsequently, the sacrificial layers are removed; and conductive layers (the gate electrode layers WL) are formed by filling a conductive material into the spaces where the sacrificial layers are removed. The manufacturing method recited above is, for example, a replacement method.

FIG. 5A to FIG. 5F are schematic cross-sectional views in order of the processes, illustrating the method for manufacturing the nonvolatile semiconductor memory device according to the second embodiment.

As shown in FIG. 5A, the stacked main body MLf is formed by alternately stacking the multiple inter-layer insulating layers 41 and multiple films 71; the hole MH is formed in the stacked main body MLf; and the side surfaces of the films 71 are caused to recede by removing portions of the films 71 via the hole MH.

In other words, first, the inter-layer insulating layer 41 is formed on the first film (one of the films 71); and the second film (one other of the films 71) is formed on the inter-layer insulating layer 41. Thereby, the stacked main body MLf is formed. The films 71 are, for example, sacrificial layers. The films 71 include, for example, silicon nitride. The inter-layer insulating layers 41 include, for example, silicon oxide.

To remove the portions of the films 71 via the hole MH formed in the stacked main body MLf, for example, an etchant such as hydrofluoric acid or the like is used inside the hole MH. Thereby, the side surfaces of the first films 71 inside the hole MH recede. Thus, the first side surface WLs1 of the first film (the one of the films 71) and the second side surface WLs2 of the second film (the one other of the films 71) are caused to recede. A portion of the upper surface 41U of the inter-layer insulating layer 41 and a portion of the lower surface 41L of the inter-layer insulating layer 41 are exposed. The spaces SP are formed inside the hole MH by the films 71 being etched.

As shown in FIG. 5B, the blocking insulating layer 31 is formed on the side wall of the hole MH; and the semiconductor film 20f is further formed.

The blocking insulating layer 31 is formed on the first side surface WLs1 caused to recede, the second side surface WLs2 caused to recede, the portion of the upper surface 41U recited above, the portion of the lower surface 41L recited above, and the side surface of the inter-layer insulating layer 41. For example, on the side wall of the hole MH, the first blocking film 31a is formed; and the second blocking film 31b is further formed. The first blocking film 31a includes, for example, at least one of aluminum oxide, hafnium oxide, lanthanum oxide, or zirconia oxide. The second blocking film 31b includes, for example, silicon oxide.

For example, the semiconductor film 20f is formed to cover the blocking insulating layer 31. The spaces SP are filled with a portion of the semiconductor film 20f. Similarly to that described above, the semiconductor film 20f includes the first portion 20fp, the second portion 20fq, and the third portion 20fr. The first portion 20fp overlaps the first film in the second direction crossing the direction from the first film (the one of the films 71) recited above toward the second film (the one other of the films 71) recited above. The second portion 20fq overlaps the second film in the second direction. The third portion 20fr overlaps the inter-layer insulating layer 41 in the second direction.

Subsequently, a portion of the blocking insulating layer 31 is exposed by removing the third portion 20fr of the semiconductor film 20f recited above. In this process, the following processing is performed.

As shown in FIG. 5C, a portion (the portion 20fb) of the semiconductor film 20f is oxidized via the hole MH. The portion 20fa that is provided inside the spaces SP of the semiconductor film 20f is not oxidized. On the other hand, the oxidized portion 20fb of the semiconductor film 20f becomes the oxide film 20fo. Then, the oxide film 20fo is etched via the hole MH. For example, an etchant including hydrofluoric acid is used in the etching. Thereby, the oxide film 20fo is removed. The portion 20fa (the first portion 20fp and the second portion 20fq) of the semiconductor film 20f are exposed inside the hole MH by the removal of the oxide film 20fo. The portion 31p of the blocking insulating layer 31 formed on the side wall of the inter-layer insulating layer 41 is exposed inside the hole MH.

As shown in FIG. 5D, the charge storage layer 20N is formed by nitriding a portion of the first portion 20fp of the semiconductor film 20f and a portion of the second portion 20fq. In other words, the first charge storage layer 21N is formed from the portion of the first portion 20fp recited above; and the second charge storage layer 22N is formed from the portion of the second portion 20fq recited above. In the processing, for example, a portion of the portion 20fa of the semiconductor film 20f is nitrided via the hole MH. The nitrided portion of the portion 20fa of the semiconductor film 20f becomes the charge storage layer 20N. The remaining portion of the portion 20fa of the semiconductor film 20f becomes the multiple semiconductor layers 20 (e.g., the first semiconductor layer 21 and the second semiconductor layer 22). At this time, the intermediate region 20M may be formed between the semiconductor layer 20 and the charge storage layer 20N.

As shown in FIG. 5E, the tunneling insulating layer 33 is formed on the first charge storage layer 21N, the second charge storage layer 22N, and the exposed portion 31p of the blocking insulating layer 31. Further, the channel layer 51 is formed on a portion of the tunneling insulating layer 33. The core insulating film 52 is formed as necessary.

As shown in FIG. 5F, a slit ST that pierces the stacked main body MLf (the first films recited above, the inter-layer insulating layers 41, and the second films recited above) in the Z-direction is formed. For example, the slit ST spreads in the Z-direction and the Y-direction. Then, the films 71 (the first films and the second films recited above) inside the slit ST are removed. In the processing, for example, an etchant such as hydrofluoric acid or the like is introduced to the slit ST. Thereby, the films 71 are removed.

The gate electrode layers WL are formed by filling a conductive material into the spaces formed where the films 71 are removed. In other words, the first gate electrode layer WL1 is formed in the space remaining where the first film (the one of the films 71) is removed; and the second gate electrode layer WL2 is formed in the space remaining where the second film (the one other of the films 71) is removed. The gate electrode layer WL is formed using a material including, for example, tungsten. The gate electrode layer WL may be formed using, for example, polysilicon including an impurity.

By the processes recited above, a nonvolatile semiconductor memory device that is similar to the nonvolatile semiconductor memory device 101 (referring to FIG. 1) is manufactured.

According to the second embodiment, a method for manufacturing a nonvolatile semiconductor memory device can be provided in which the reliability can be increased.

In the manufacturing method recited above, for example, the formation of the blocking insulating layer 31 may be omitted in the process shown in FIG. 5B described above. In such a case, for example, the blocking insulating layer 31 may be formed via the spaces where the films 71 are removed in the process shown in FIG. 5F. In such a case, the blocking insulating layers 31 are provided between the semiconductor layers 20 and the gate electrode layers WL.

An example of the configuration of the channel layer 51 of the nonvolatile semiconductor memory device according to the embodiment will now be described.

Figure 6A:
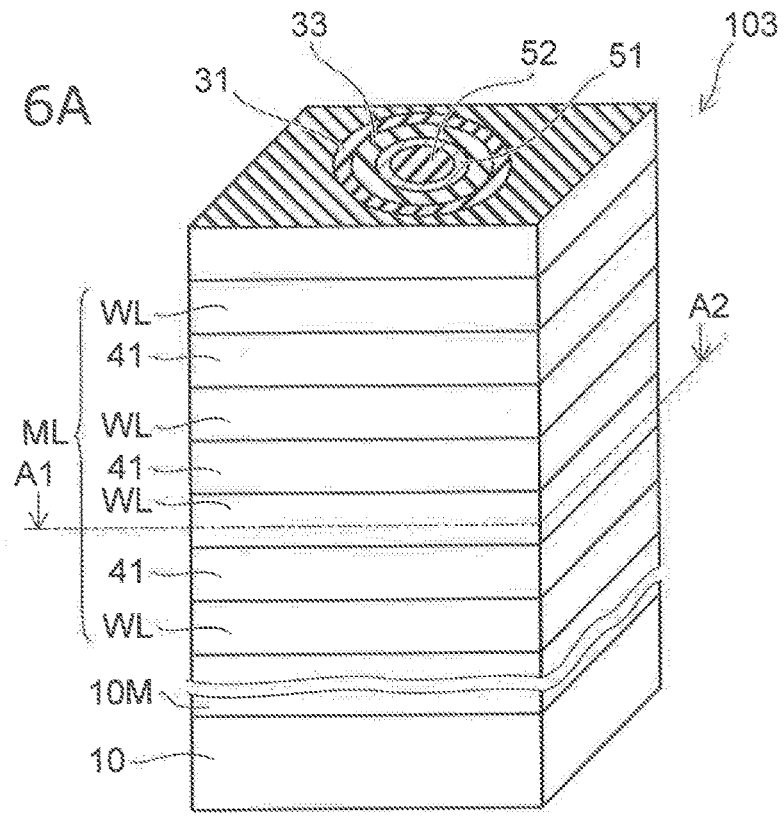
FIG. 6A and FIG. 6B are schematic views illustrating the nonvolatile semiconductor memory device according to the embodiment.
Figure 6B:
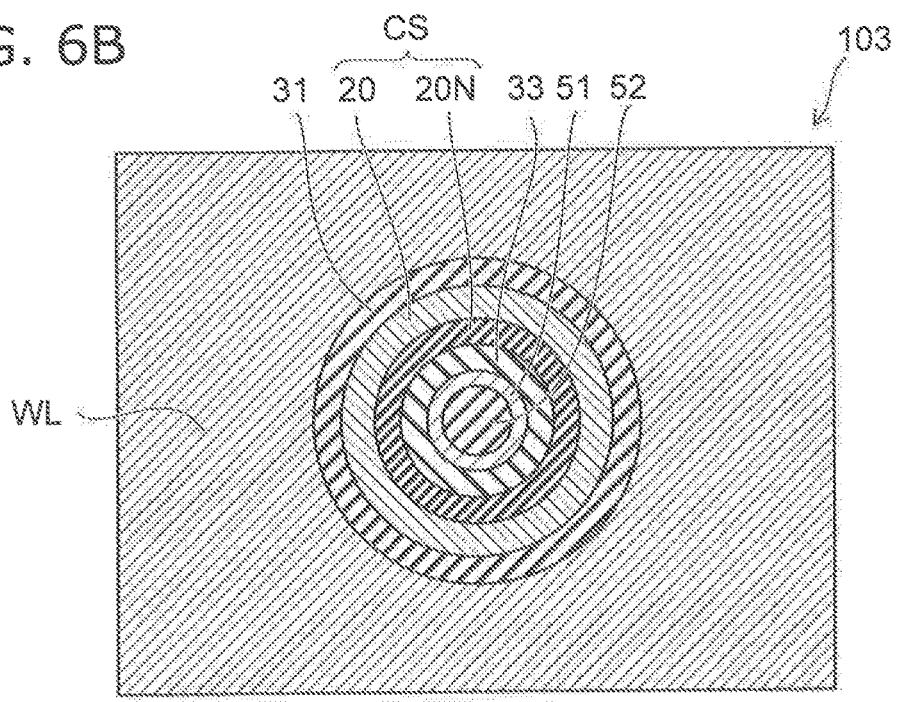

FIG. 6A and FIG. 6B are schematic views illustrating the nonvolatile semiconductor memory device according to the embodiment.

FIG. 6A is a perspective view. FIG. 6B is a cross-sectional view along line A1-A2 shown in FIG. 6A.

In the nonvolatile semiconductor memory device 103 as shown in FIG. 6A, the channel layer 51 has a pipe configuration extending in the Z-direction through the stacked body ML. The core insulating film 52 is provided inside the channel layer 51 having the pipe configuration. The core insulating film 52 has a substantially circular columnar configuration extending in the Z-direction. The channel layer 51 is provided between the stacked body ML and the core insulating film 52. The blocking insulating layer 31 is provided between the stacked body ML and the channel layer 51. The tunneling insulating layer 33 is provided between the blocking insulating layer 31 and the channel layer 51.

As shown in FIG. 6B, the charge storage portions CS are provided between the channel layer 51 and the gate electrode layers WL and between the blocking insulating layer 31 and the tunneling insulating layer 33.

Figure 7:
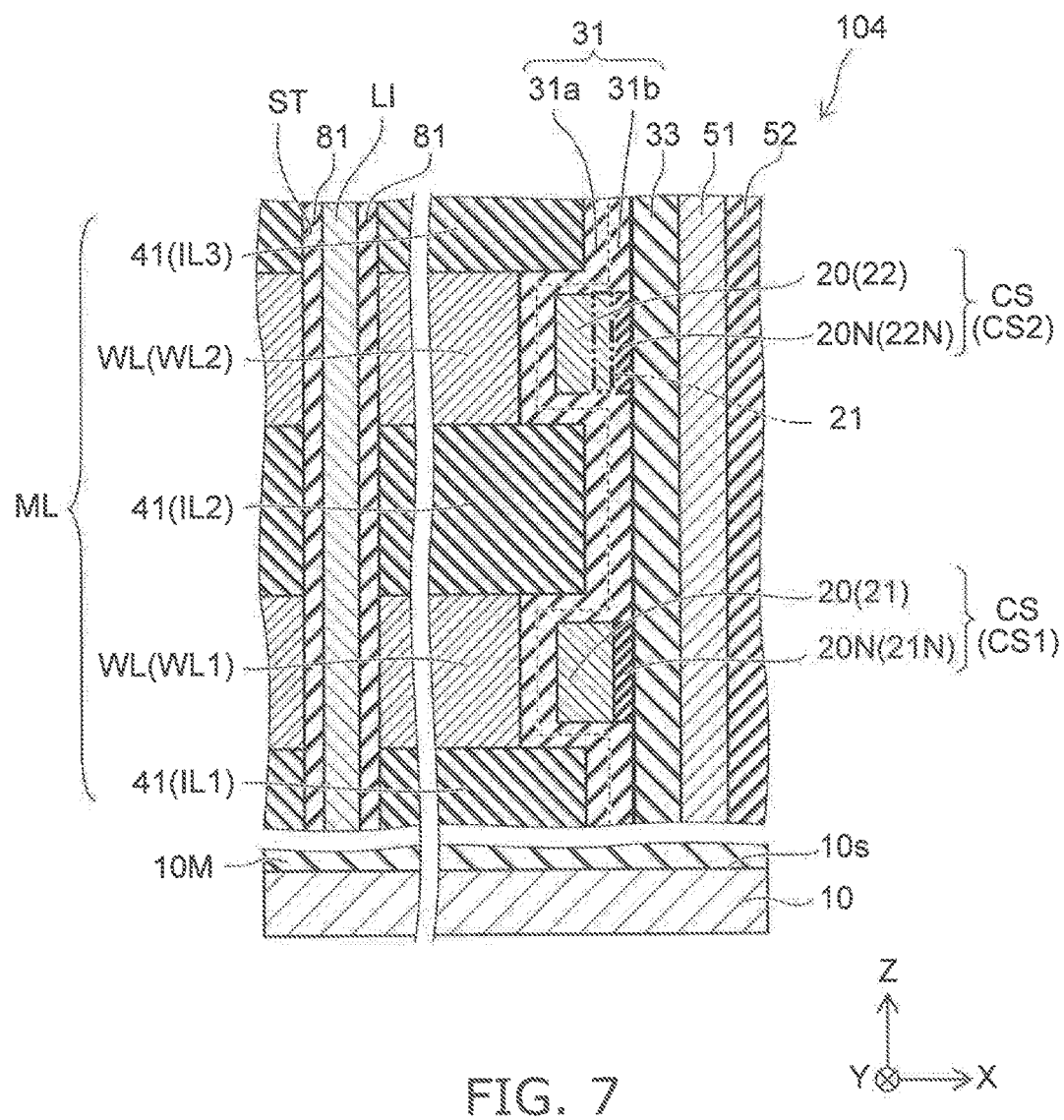
FIG. 7 is a schematic cross-sectional view illustrating another nonvolatile semiconductor memory device according to the embodiment.

FIG. 7 is a schematic cross-sectional view illustrating another nonvolatile semiconductor memory device according to the embodiment.

In the nonvolatile semiconductor memory device 104 shown in FIG. 7, a conductive unit LI that extends in the Z-direction through the stacked body ML is provided. For example, the conductive unit LI spreads in the Z-direction and the Y-direction. An insulating film 81 is provided between the conductive unit LI and the stacked body ML. Otherwise, the configuration is similar to that of the nonvolatile semiconductor memory device 101. For example, the nonvolatile semiconductor memory device 104 may be made by the method (the replacement method) described in reference to FIG. 5A to FIG. 5F. For example, the processes shown in FIG. 5A to FIG. 5F are implemented. Namely, as illustrated in FIG. 5F, the films 71 are removed via the slit ST; and the gate electrode layers WL are formed by filling a conductive material into the spaces formed by the removal. Subsequently, the insulating film 81 is formed on the side wall of the slit ST. Further, the conductive unit LI is formed by filling a conductive material into the remaining space of the slit ST. Thereby, the nonvolatile semiconductor memory device 104 is manufactured.

Figure 8:
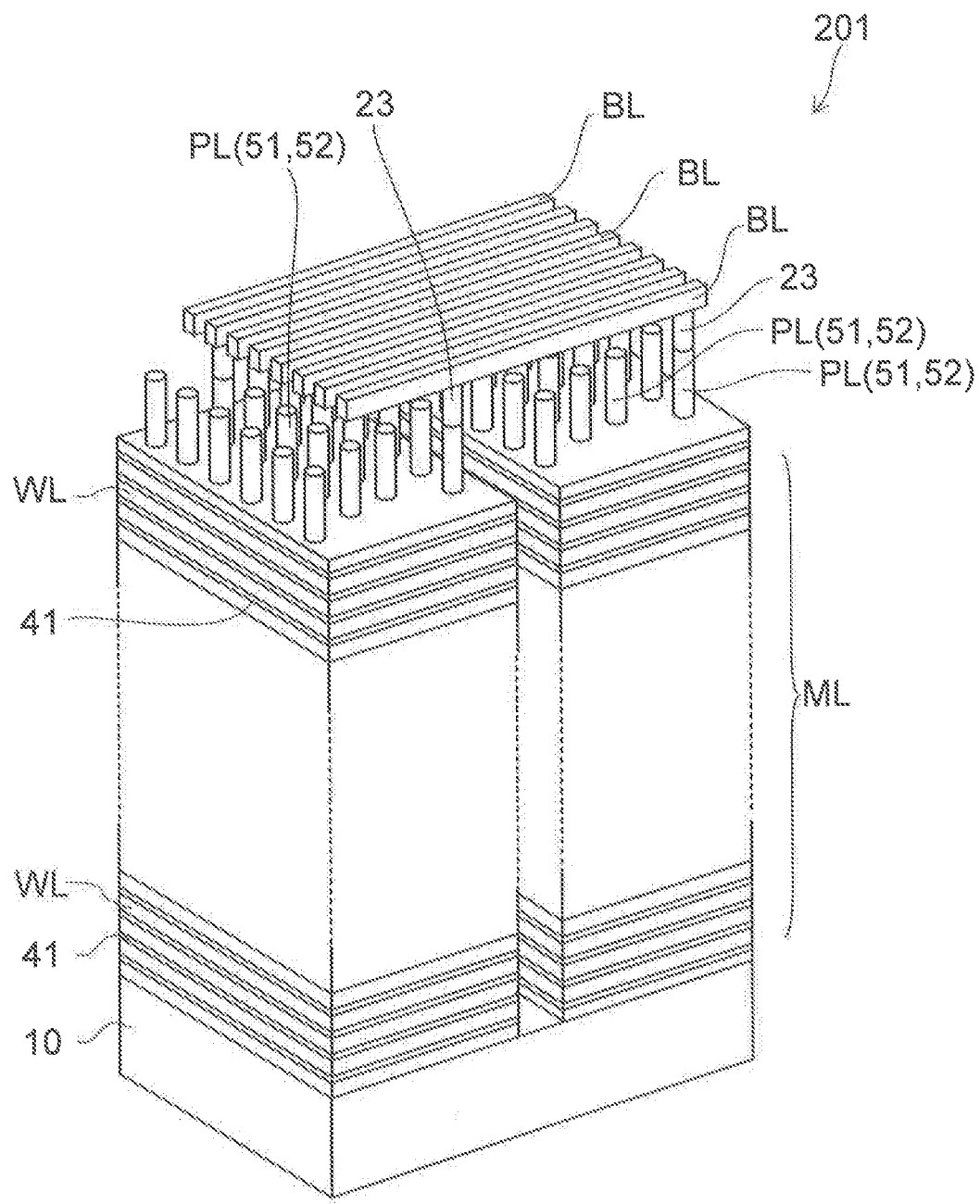
FIG. 8 is a schematic perspective view illustrating another nonvolatile semiconductor memory device according to the embodiment.

FIG. 8 is a schematic perspective view illustrating another nonvolatile semiconductor memory device according to the embodiment.

The substrate 10 (the semiconductor substrate) is provided in the nonvolatile semiconductor memory device 201 as shown in FIG. 8. The stacked body ML that includes the multiple gate electrode layers WL and the multiple inter-layer insulating layers 41 stacked alternately is provided on the substrate 10.

A pillar PL that extends in the Z-direction through the stacked body ML is provided. The pillar PL includes, for example, the channel layer 51 and the core insulating film 52. The blocking insulating layer 31, the semiconductor layer 20, the charge storage layer 20N, and the tunneling insulating layer 33 are provided between the pillar PL and the stacked body ML (not illustrated in FIG. 8).

For example, a bit line BL that extends in the X-direction is provided on the stacked body ML. A contact plug 23 is provided between the pillar PL and the bit line BL. The pillar PL is electrically connected to the contact plug 23. The contact plug 23 is electrically connected to the bit line BL. In other words, the pillar PL is electrically connected to the bit line BL via the contact plug 23. In the nonvolatile semiconductor memory device 201 as well, the reliability can be increased.

Figure 9:
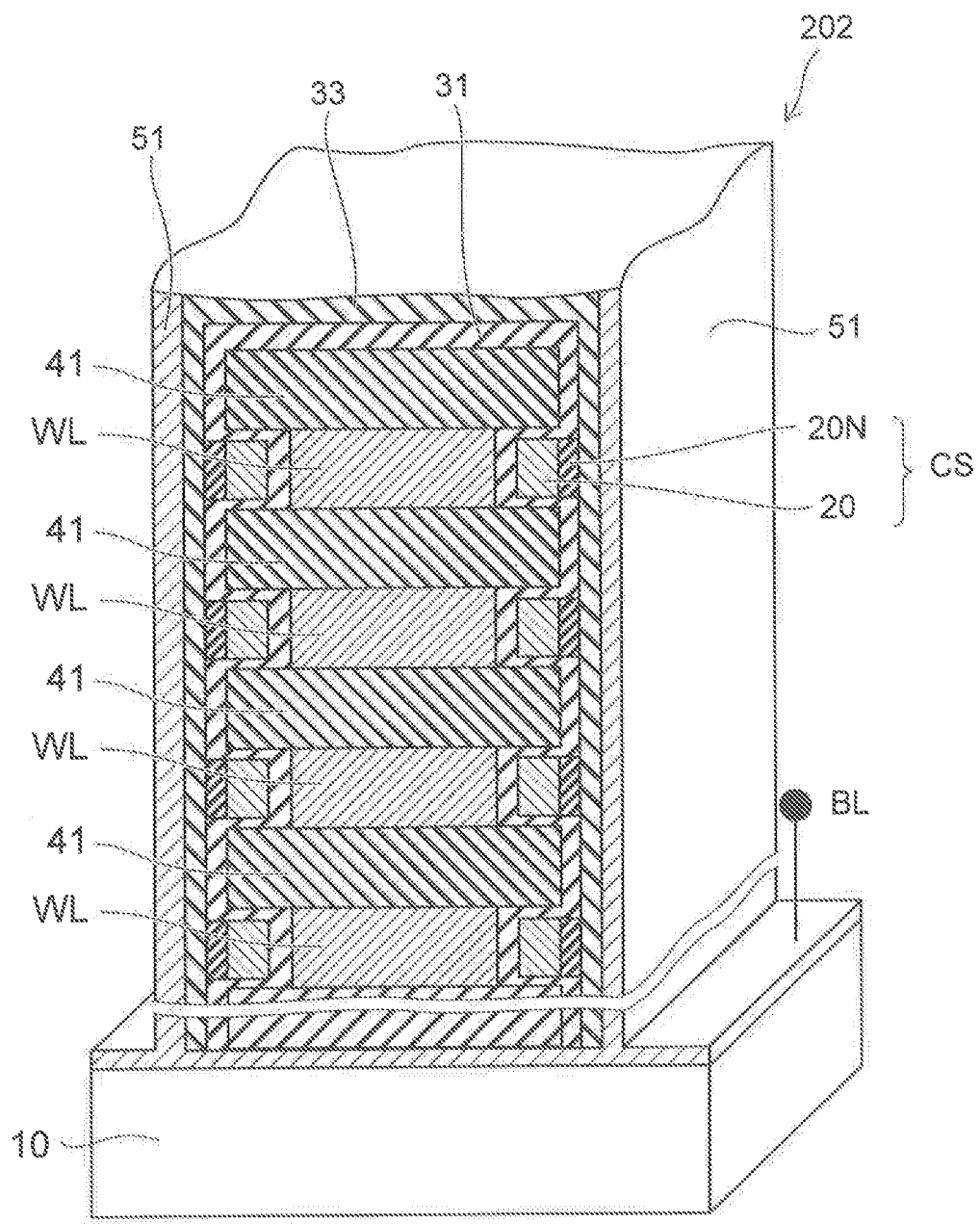
FIG. 9 is a schematic perspective view illustrating another nonvolatile semiconductor memory device according to the embodiment.

FIG. 9 is a schematic perspective view illustrating another nonvolatile semiconductor memory device according to the embodiment.

In the example, the memory cells are provided at the side surface of the stacked body ML.

In the nonvolatile semiconductor memory device 202 as shown in FIG. 9, the stacked body ML is provided on the substrate 10. The side surfaces of the gate electrode layers WL recede from the side surfaces of the inter-layer insulating layers 41. These side surfaces are surfaces crossing the X-Y plane. The channel layer 51 is provided on the side surface of the stacked body ML. The tunneling insulating layer 33 is provided between the stacked body ML and the channel layer 51.

The charge storage portions CS are provided between the tunneling insulating layer 33 and the gate electrode layers WL. The blocking insulating layer 31 is provided between the gate electrode layers WL and the charge storage portions CS, between the inter-layer insulating layers 41 and the charge storage portions CS, and between the tunneling insulating layer 33 and the inter-layer insulating layers 41.

The charge storage portion CS includes the semiconductor layer 20 and the charge storage layer 20N. The charge storage layer 20N is provided between the semiconductor layer 20 and the tunneling insulating layer 33. In the example, the core insulating film 52 is not provided. In the nonvolatile semiconductor memory device 202 as well, the reliability can be increased.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the nonvolatile semiconductor memory device such as the gate electrode layer, the inter-layer insulating layer, the channel layer, the tunneling insulating layer, the charge storage portion, the blocking insulating layer, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all nonvolatile semiconductor memory devices and methods for manufacturing the same practicable by an appropriate design modification by one skilled in the art based on the nonvolatile semiconductor memory devices and methods for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device, comprising:
    a first gate electrode layer;
    a second gate electrode layer separated from the first gate electrode layer in a first direction;
    an inter-layer insulating layer provided between the first gate electrode layer and the second gate electrode layer;
    a channel layer separated in a second direction from the first gate electrode layer, the second gate electrode layer, and the inter-layer insulating layer, the second direction crossing the first direction;
    a tunneling insulating layer provided between the first gate electrode layer and the channel layer and between the second gate electrode layer and the channel layer;
    a first charge storage portion including a first semiconductor layer and being provided between the first gate electrode layer and the tunneling insulating layer;
    a second charge storage portion including a second semiconductor layer and being provided between the second gate electrode layer and the tunneling insulating layer; and
    a blocking insulating layer,
    wherein
        the first charge storage portion further includes a first charge storage layer provided between the first semiconductor layer and the tunneling insulating layer,
        the second charge storage portion further includes a second charge storage layer provided between the second semiconductor layer and the tunneling insulating layer,
        the blocking insulating layer is provided between the inter-layer insulating layer and the tunneling insulating layer, between the first gate electrode layer and the first semiconductor layer, between the inter-layer insulating layer and the first semiconductor layer, between the inter-layer insulating layer and the second semiconductor layer, between the second gate electrode layer and the second semiconductor layer, and between the first charge storage layer and the second charge storage layer,
        the first charge storage layer and the second charge storage layer include silicon nitride, and
        a region where a nitrogen concentration changes is provided between the first semiconductor layer and the first charge storage layer and between the second semiconductor layer and the second charge storage layer.

2. The device according to claim 1, further comprising a semiconductor substrate,
    the first gate electrode layer, the inter-layer insulating layer, the second gate electrode layer, the channel layer, the tunneling insulating layer, the first charge storage portion, the second charge storage portion, and the blocking insulating layer being provided above the semiconductor substrate, a major surface of the semiconductor substrate crossing the first direction.

3. The device according to claim 1, wherein the blocking insulating layer includes a portion between the inter-layer insulating layer and the tunneling insulating layer, a portion between the first gate electrode layer and the first charge storage portion, a portion between the inter-layer insulating layer and the first charge storage portion, a portion between the inter-layer insulating layer and the second charge storage portion, and a portion between the second gate electrode layer and the second charge storage portion, the portions of the blocking insulating layer being provided as one body.

4. The device according to claim 1, wherein the blocking insulating layer includes a first blocking film and a second blocking film.

5. The device according to claim 4, wherein
    the first blocking film is provided between the first gate electrode layer and the first charge storage portion, between the inter-layer insulating layer and the first charge storage portion, between the inter-layer insulating layer and the second charge storage portion, and between the second gate electrode layer and the second charge storage portion, and
    the second blocking film is provided between the first blocking film and the first charge storage portion and between the first blocking film and the second charge storage portion.

6. The device according to claim 4, wherein
the first blocking film includes at least one selected from the group consisting of aluminum oxide, hafnium oxide, lanthanum oxide, and zirconia oxide, and
the second blocking film includes silicon oxide.

7. The device according to claim 1, wherein a portion of the blocking insulating layer is arranged in the first direction with at least a portion of the first charge storage portion.

8. The device according to claim 1, wherein the first semiconductor layer and the second semiconductor layer include silicide.

9. The device according to claim 8, wherein the silicide includes at least one selected from the group consisting of nickel, cobalt, ruthenium, and titanium.

10. The device according to claim 1, wherein the first semiconductor layer and the second semiconductor layer include boron.

11. A method for manufacturing a nonvolatile semiconductor memory device, comprising:
forming an inter-layer insulating layer on a first film, and forming a second film on the inter-layer insulating layer;
exposing a portion of an upper surface of the inter-layer insulating layer and a portion of a lower surface of the inter-layer insulating layer by causing a first side surface of the first film and a second side surface of the second film to recede;
forming a blocking insulating layer on the first side surface caused to recede, on the second side surface caused to recede, on the portion of the upper surface, on the portion of the lower surface, and on a side surface of the inter-layer insulating layer;
forming a semiconductor film to cover the blocking insulating layer, the semiconductor film including a first portion, a second portion, and a third portion, the first portion overlapping the first film in a second direction, the second portion overlapping the second film in the second direction, the third portion overlapping the inter-layer insulating layer in the second direction, the second direction crossing a direction from the first film toward the second film;
removing the third portion for exposing a portion of the blocking insulating layer;
nitriding a portion of the first portion and a portion of the second portion for forming a first charge storage layer from the portion of the first portion and forming a second charge storage layer from the portion of the second portion;
forming a tunneling insulating layer on the portion of the first portion being nitrided, on the portion of the second portion being nitrided, and on the portion of the blocking insulating layer being exposed; and
forming a channel layer on a portion of the tunneling insulating layer.

12. The method according to claim 11, further comprising:
forming a hole piercing the first film, the inter-layer insulating layer, and the second film after the forming of the inter-layer insulating layer on the first film and the forming of the second film on the inter-layer insulating layer and prior to the exposing of the portion of the upper surface of the inter-layer insulating layer and the portion of the lower surface of the inter-layer insulating layer,
the exposing of the portion of the upper surface of the inter-layer insulating layer and the portion of the lower surface of the inter-layer insulating layer including etching the first film and the second film inside the memory hole.

13. The method according to claim 11, further comprising:
forming a slit piercing the first film, the inter-layer insulating layer, and the second film;
removing the first film and the second film inside the slit; and
forming a first gate electrode layer in a space where the first film is removed, and forming a second gate electrode layer in a space where the second film is removed.

14. The method according to claim 11, wherein
the forming of the blocking insulating layer includes:
forming a first blocking film; and
forming a second blocking film.

15. The method according to claim 14, wherein the first blocking film is formed using a material including at least one selected from the group consisting of aluminum oxide, hafnium oxide, lanthanum oxide, and zirconia oxide, and the second blocking film is formed using a material including silicon oxide.

16. The method according to claim 11, further comprising forming a metal layer to cover a portion of the first portion and a portion of the second portion, and removing the metal layer, the forming and removing of the metal layer being performed after the exposing of the portion of the blocking insulating layer and prior to the forming of the first charge storage layer from the portion of the first portion and the forming of the second charge storage layer from the portion of the second portion.

17. The method according to claim 16, wherein the metal layer is formed using a material including at least one selected from the group consisting of nickel, cobalt, ruthenium, and titanium.

* * * * *